US012623258B2

(12) United States Patent
Kobayashi et al.

(10) Patent No.: US 12,623,258 B2
(45) Date of Patent: May 12, 2026

(54) GAS CLEANING METHOD, METHOD OF PROCESSING SUBSTRATE, METHOD OF MANUFACTURING SEMICONDUCTOR DEVICE, RECORDING MEDIUM, AND SUBSTRATE PROCESSING APPARATUS

(71) Applicant: Kokusai Electric Corporation, Tokyo (JP)

(72) Inventors: Takahiro Kobayashi, Toyama (JP); Iwao Nakamura, Toyama (JP); Toru Harada, Toyama (JP); Hisashi Nomura, Toyama (JP); Sadayoshi Horii, Toyama (JP)

(73) Assignee: KOKUSAI ELECTRIC CORPORATION, Tokyo (JP)

( * ) Notice: Subject to any disclaimer, the term of this patent is extended or adjusted under 35 U.S.C. 154(b) by 513 days.

(21) Appl. No.: 18/162,756

(22) Filed: Feb. 1, 2023

(65) Prior Publication Data

US 2023/0294145 A1     Sep. 21, 2023

(30) Foreign Application Priority Data

Mar. 18, 2022     (JP) ................................. 2022-044570

(51) Int. Cl.
    *B08B 5/00*     (2006.01)
    *C23C 16/44*     (2006.01)
    *H01L 21/02*     (2006.01)
(52) U.S. Cl.
    CPC ............ *B08B 5/00* (2013.01); *C23C 16/4404* (2013.01); *C23C 16/4405* (2013.01);
    (Continued)

(58) Field of Classification Search
    CPC ..... B08B 5/00; B08B 9/0804; C23C 16/4404; C23C 16/4405; H01L 21/02164;
    (Continued)

(56) References Cited

U.S. PATENT DOCUMENTS

2002/0020433 A1    2/2002  Suemura et al.
2008/0317975 A1    12/2008  Furui et al.
(Continued)

FOREIGN PATENT DOCUMENTS

JP        07-122493  A      5/1995
JP        2005-294512  A      10/2005
(Continued)

OTHER PUBLICATIONS

Korean Office Action issued on Nov. 8, 2024 for Korean Patent Application No. 10-2023-0012657.
(Continued)

*Primary Examiner* — S M Sohel Imtiaz
(74) *Attorney, Agent, or Firm* — Volpe Koenig

(57)     ABSTRACT

A gas cleaning method includes: (a) removing a first metal element as one of contaminants from a process chamber by supplying a chlorine-containing gas into the process chamber without supplying an oxygen-containing gas; and (b) removing a second metal element as another one of the contaminants from the process chamber by supplying the oxygen-containing gas into the process chamber, wherein (b) is performed after (a).

17 Claims, 6 Drawing Sheets

(52) U.S. Cl.
CPC .... *H01L 21/02164* (2013.01); *H01L 21/0223* (2013.01); *H01L 21/02255* (2013.01)

(58) Field of Classification Search
CPC .......... H01L 21/0223; H01L 21/02255; H01L 21/02057; H01L 21/67028; H01J 37/32862
See application file for complete search history.

(56) References Cited

U.S. PATENT DOCUMENTS

| | | | | |
|---|---|---|---|---|
| 2009/0041650 | A1* | 2/2009 | Watanabe | C23C 16/4405 423/335 |
| 2013/0260566 | A1* | 10/2013 | Yamazaki | C23C 16/54 134/22.18 |
| 2015/0232986 | A1* | 8/2015 | Kameda | C23C 16/45546 438/758 |
| 2015/0376781 | A1* | 12/2015 | Kogura | C23C 16/4405 438/758 |
| 2018/0286662 | A1* | 10/2018 | Nagatomi | C23C 16/405 |
| 2019/0255576 | A1* | 8/2019 | Kuribayashi | C23C 16/4405 |
| 2019/0368036 | A1* | 12/2019 | Kuribayashi | C23C 16/4405 |
| 2020/0294777 | A1 | 9/2020 | Hirota et al. | |
| 2020/0303186 | A1* | 9/2020 | Nakatani | H01L 21/02271 |
| 2021/0001383 | A1 | 1/2021 | Yamazaki | |
| 2021/0193486 | A1* | 6/2021 | Li | C23C 16/4408 |

FOREIGN PATENT DOCUMENTS

| | | | | | |
|---|---|---|---|---|---|
| JP | 2013-058561 | A | 3/2013 | | |
| JP | 2013-229575 | A | 11/2013 | | |
| JP | 2019-212740 | A | 12/2019 | | |
| JP | 2021-012951 | A | 2/2021 | | |
| KR | 10-2007-0065476 | A | 7/2007 | | |
| KR | 100989974 | B1 | 10/2010 | | |
| WO | 2001/071790 | A1 | 9/2001 | | |
| WO | 2006/082724 | A1 | 8/2006 | | |
| WO | 2018/180663 | A1 | 10/2018 | | |
| WO | WO-2020050124 | A1 * | 3/2020 | ......... | C23C 16/4408 |
| WO | WO-2023282190 | A1 * | 1/2023 | .............. | B08B 5/00 |

OTHER PUBLICATIONS

Chinese Office Action issued on Apr. 11, 2025 for Chinese Patent Application No. 202310057918.9.
Taiwan Office Action issued on Oct. 6, 2023 for Taiwan Patent Application No. 111148826.
Japanese Office Action issued on Mar. 5, 2024 for Japanese Patent Application No. 2022-209069.
Extended European Search Report issued on Jul. 19, 2023 for European Patent Application No. 23154208.5.

* cited by examiner

FIG. 5

| Element | Na | Al | Ti | Cr | Fe | Ni | Cu | Contamination reduction mechanism |
|---|---|---|---|---|---|---|---|---|
| Atomic value | 1 | 3 | 4 | 3 | 3 | 2 | 2 | |
| Standard electrode potential(V) | -2.71 | -1.662 | -1.534 | -0.744 | -0.447 | -0.257 | 0.342 | |
| Chloride | NaCl | AlCl3 | TiCl4 | CrCl3 | FeCl2 | NiCl2 | CuCl | By chlorinating element, element is volatilized to be easily discharged |
| Standard production enthalpy [KJ/mol] | -411.2 | -704.2 | -804.2 | -556.5 | -341.8 | -305.3 | -137.2 | |
| Oxide | Na2O | α-Al2O3 | TiO2(rutile) | Cr2O3 | Fe2O3 | NiO | CuO | By oxidizing element, element is stabilized |
| Standard production enthalpy [KJ/mol] | -414.6 | -1675.7 | -944.7 | -1139.7 | -824.2 | -239.7 | -157.3 | |

Figure 7:
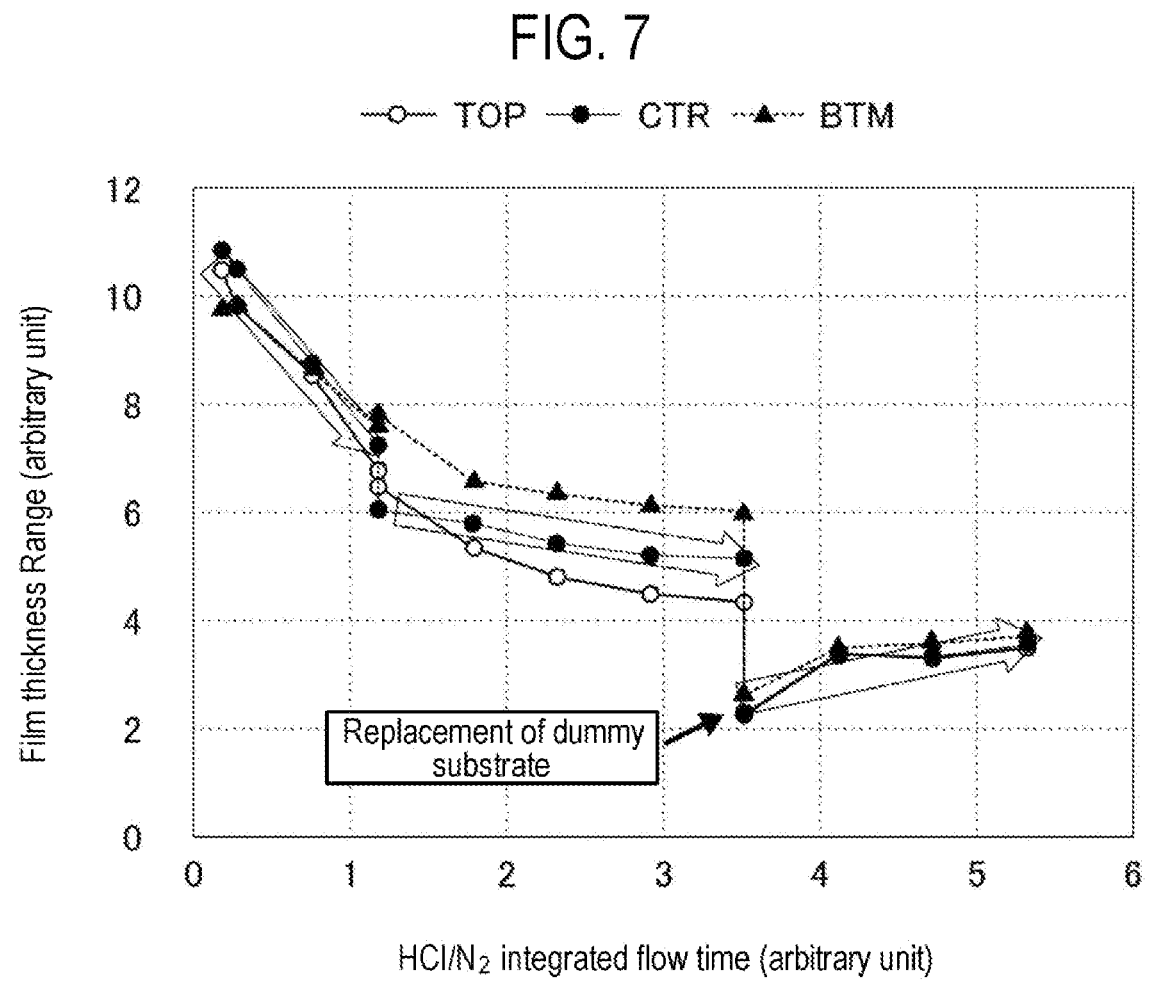

—○— TOP —●— CTR ┄▲┄ BTM

Film thickness Range (arbitrary unit)

12

10

8

6

4

2

0

Replacement of dummy substrate 0    1    2    3    4    5    6

$HCl/N_2$ integrated flow time (arbitrary unit)

GAS CLEANING METHOD, METHOD OF PROCESSING SUBSTRATE, METHOD OF MANUFACTURING SEMICONDUCTOR DEVICE, RECORDING MEDIUM, AND SUBSTRATE PROCESSING APPARATUS

CROSS-REFERENCE TO RELATED APPLICATION

This application is based upon and claims the benefit of priority from Japanese Patent Application No. 2022-044570, filed on Mar. 18, 2022, the entire contents of which are incorporated herein by reference.

TECHNICAL FIELD

The present disclosure relates to a gas cleaning method, a method of processing a substrate, a method of manufacturing a semiconductor device, a recording medium, and a substrate processing apparatus.

BACKGROUND

As a process of manufacturing a semiconductor device, a process of cleaning contaminants in a process chamber may be performed before processing a substrate.

The related art discloses a cleaning method of removing a SiC film formed on a member in a process chamber by gas cleaning while preventing an inner wall of a graphite nozzle from being excessively etched.

SUMMARY

In a cleaning method performed in the state in which an oxygen-containing gas is present in the process chamber, metal impurities in the process chamber may be oxidized, which may make it difficult to etch the metal impurities and remove the metal impurities from the process chamber. As a result, the surface of a substrate may be contaminated with metal impurities and the thickness of an oxide film formed on the surface of the substrate may be uneven.

The present disclosure provides a technique capable of forming a film having a more uniform thickness on the surface of a substrate.

According to one embodiment of the present disclosure, there is provided a gas cleaning method including: (a) removing a first metal element as one of contaminants from a process chamber by supplying a chlorine-containing gas into the process chamber without supplying an oxygen-containing gas; and (b) removing a second metal element as another one of the contaminants from the process chamber by supplying the oxygen-containing gas into the process chamber, wherein (b) is performed after (a).

The accompanying drawings, which are incorporated in and constitute a part of the specification, illustrate embodiments of the present disclosure.

FIG. 5 is a view showing relationships between elements and standard electrode potentials, standard production enthalpies of chlorides, and standard production enthalpies of oxides.

FIG. 6 is a graph showing an aluminum contamination density (number of atoms per unit area) in a process chamber with respect to an integrated flow time (hours) of a mixed gas of HCl and $N_2$.

FIG. 7 is a graph showing a film thickness range versus the integrated flow time (hours) of a mixed gas of HCl and $N_2$.

DETAILED DESCRIPTION

Figure 1:
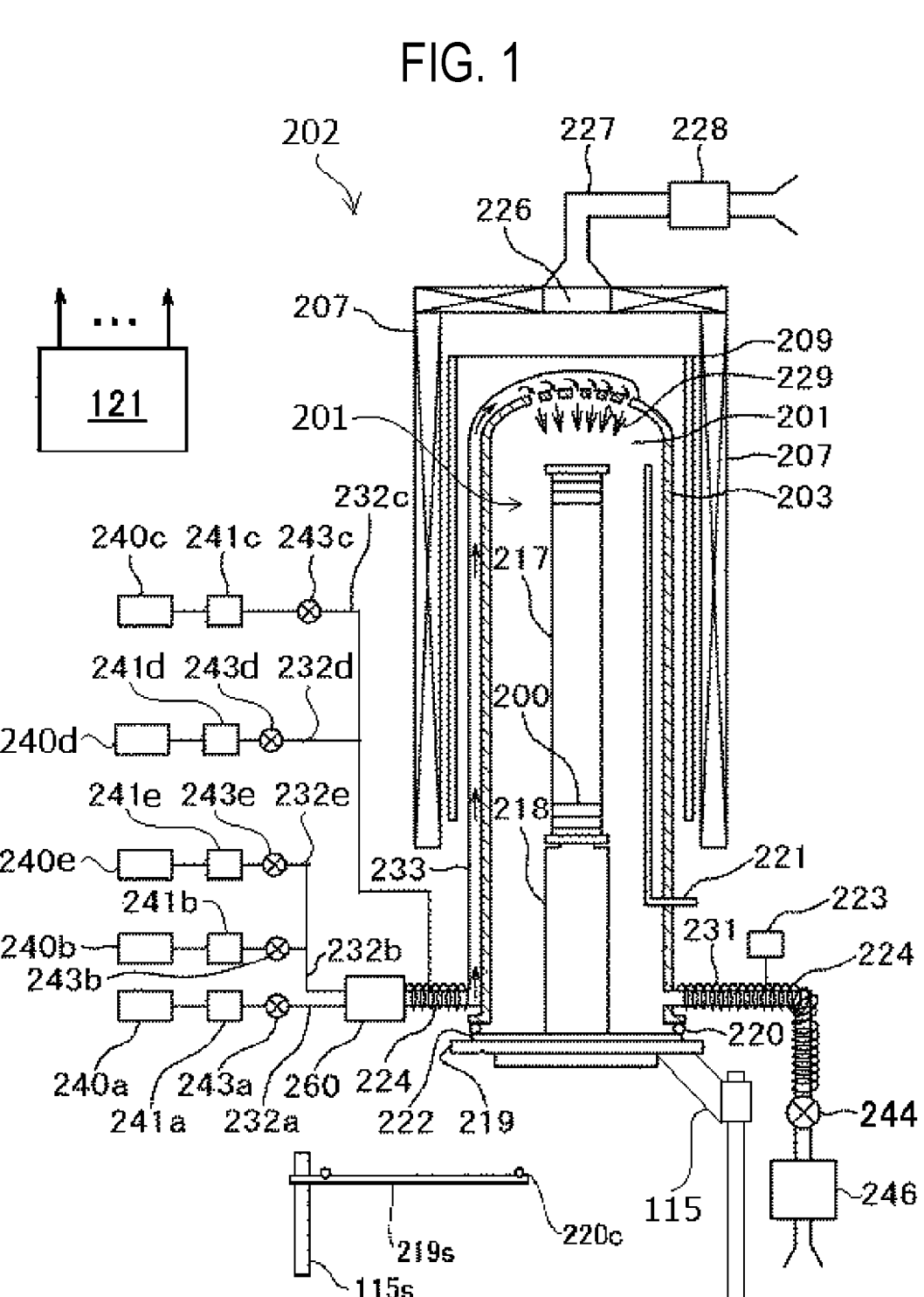
FIG. 1 is a schematic configuration of a vertical process furnace of a substrate processing apparatus suitably used in embodiments of the present disclosure, in which a portion of a process furnace 202 is shown in a vertical cross section.

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

Embodiments of the Present Disclosure

Embodiments of the present disclosure will be described below mainly with reference to FIGS. 1 to 4. The drawings used in the following description are all schematic, and the dimensional relationship of respective elements, the ratios of respective elements, and the like shown in the drawings do not necessarily match the actual ones. In addition, the dimensional relationships of respective elements, the ratio of respective elements, and the like do not necessarily match among a plurality of drawings.

(1) Configuration of Substrate Processing Apparatus

As illustrated in FIG. 1, a process furnace 202 includes a heater 207 as a temperature regulator (heating part). The heater 207 has a cylindrical shape and is installed vertically by being supported by a holding plate. The heater 207 also functions as an activation mechanism (excitation part) that thermally activates (excites) gas.

Inside the heater 207, a reaction tube 203 and a soaking tube 209 are arranged concentrically with the heater 207. The reaction tube 203 is made of a heat-resistant material such as quartz ($SiO_2$) or silicon carbide (SiC), and has a cylindrical shape including an upper end connected to a gas supply path 233 and an opened lower end. Below the reaction tube 203, a disk-shaped seal cap 219 is installed as a furnace port lid capable of closing the lower end opening of the reaction tube 203. When the seal cap 219 is made of a metal material such as SUS, a protective plate 222 made of, for example, quartz may be installed on a top surface of the seal cap 219. An O-ring 220 as a sealing member is installed between the seal cap 219 or protective plate 222 and the reaction tube 203. The reaction tube 203 is mounted vertically like the heater 207. A process container is mainly configured with the reaction tube 203 and the seal cap 219, and a process chamber 201 is formed in the process container. Fused quartz is generally used as a material of the reaction tube 203 or the like, which constitutes the inner wall of the process chamber, and it is desirable that the surface is coated with synthetic quartz or the like. The process chamber 201 is configured to accommodate a wafer 200 as a substrate. The wafer 200 is processed in the process chamber 201.

A boat 217 as a substrate support is mounted on the seal cap 210 and is configured to support a plurality of wafers 200 (e.g., 25 to 200 wafers 200) in multiple stages in a horizontal posture and in the state of being aligned vertically with the centers thereof aligned with each other, that is, to allow the wafers to be arranged at intervals. The boat 217 is made of a heat-resistant material such as silicon, quartz, or SiC. At the bottom of the boat 217, a heat insulating plate 218 made of a heat-resistant material such as quartz or SiC is supported in multiple stages.

The gas supply path 233 is a vertically extending flow path configured to introduce gas into the reaction tube 203 from the lower end outside the heater 207, and may be integrally installed on the outer surface of the reaction tube 203. The upper end of the gas supply path 233 communicates with the interior of the reaction tube 203 through a plurality of communication holes in the upper portion of the reaction tube 203. The lower end of the gas supply path 233 is directly or indirectly connected to gas supply pipes 232a to 232c. A horizontal portion near the lower end of the gas supply path 233 may be heated by a heater 224.

Gas sources 240a to 240c, mass flow controllers (MFC) 241a to 241c as flow controllers (flow control parts), and valves 243a to 243c as opening/closing valves are provided in the gas supply pipes 232a to 232c, respectively, sequentially from the upstream side of a gas flow. A gas supply pipe 232d is connected to the gas supply pipe 232c on the downstream side of the valve 243c, a gas supply pipe 232e is connected to the gas supply pipe 232b on the downstream side of the valve 243b, and a gas supply pipe 232d is connected to the gas supply pipe 232c on the downstream side of the valve 243c. MFCs 241d and 241e and valves 243d and 243e are provided in the gas supply pipes 232d and 232e, respectively, sequentially from the upstream side of a gas flow. The gas supply pipes 232a to 232e are made of a metal material such as stainless steel (SUS).

From the gas source 240a, a processing gas such as an oxidizing gas, which is an oxygen (O)-containing gas, is supplied to the water vapor generator 260 via the MFC 241a, the valve 243a, and the gas supply pipe 232a. As the oxidizing gas, oxygen, ozone, water, hydrogen peroxide, or the like may be used.

A gas containing a hydrogen element (hydrogen-containing gas) is supplied from the gas source 240b to the water vapor generator 260 via the MFC 241b, the valve 243b, and the gas supply pipe 232b. Hydrogen ($H_2$), water, hydrogen peroxide, or the like may be used as the hydrogen-containing gas.

The water vapor generator 260 reacts (burns) the oxidizing gas and the hydrogen-containing gas supplied from the gas supply pipes 232a and 232b and supplies a reaction product such as water vapor into the process chamber 201 through the gas supply path 233. The water vapor generator 260 may not be needed if the reaction takes place within the process chamber 201.

From the gas source 240c, a chlorine-containing gas as a first cleaning gas is supplied into the process chamber 201 via the MFC 241c, the valve 243c, the gas supply pipe 232c, the gas supply path 233, and the gas supply pipe 232c. As the chlorine-containing gas, for example, hydrogen chloride (HCl) gas, silicon chloride ($SiCl_4$) gas, chlorine ($Cl_2$) gas, dichloroethylene (DCE) gas, boron trichloride ($BCl_3$) gas, chlorine trifluoride ($ClF_3$) gas, or the like may be used.

Among them, it is desirable that the chlorine-containing gas is a hydrogen chloride (HCl) gas. When the chlorine-containing gas is HCl gas, the chlorine-containing gas does not contain carbon. Thus, carbon (C) originating from the chlorine-containing gas is not introduced into the substrate as an impurity. When the chlorine-containing gas is HCl gas, the selective ratio of metal impurities to a protective oxide film is high, and an etching action of a moderate intensity is obtained. In addition to the chlorine-containing gas, another halogen-containing gas may be used as the first cleaning gas.

An oxygen-containing gas as a second cleaning gas is supplied from the gas source 240d into the process chamber 201 via the MFC 241d, the valve 243d, the gas supply pipe 232c, and the gas supply pipe 232d. As the oxidizing gas, for example, oxygen, ozone, water, hydrogen peroxide, or the like may be used. As the oxygen-containing gas, oxygen, ozone, water, hydrogen peroxide, or the like may be used. When the oxygen-containing gas is substituted with the oxidizing gas from the gas supply pipe 232a, the gas supply pipe 232d is not essential.

An inert gas is supplied from the gas source 240e into the process chamber 201 via the MFC 241e, the valve 243e, the gas supply pipe 232e, the gas supply pipe 232b, and the water vapor generator 260. The inert gas acts as a purge gas, a carrier gas, a diluent gas, or the like. The inert gas may be a rare gas, such as a nitrogen ($N_2$) gas, an Ar gas, a He gas, a Ne gas, or a Xe gas, or the like. It is desirable that the inert gas contains at least one selected from the group of a $N_2$ gas and an Ar gas.

A first processing gas supply system (oxidizing gas supply system) is mainly configured with the gas supply pipe 232a, the MFC 241a, and the valve 243a. A second processing gas supply system (hydrogen-containing gas supply system) is mainly configured with the gas supply pipe 232b, the MFC 241b, and the valve 243b. A first cleaning gas supply system is mainly configured with the gas supply pipe 232c, the MFC 241c, and the valve 243c. A second cleaning gas supply system is mainly configured with the gas supply pipe 232d, the MFC 241d, and the valve 243d. An inert gas supply system is mainly configured with the gas supply pipe 232e, the MFC 241e, and the valve 243e. A similar inert gas supply system may be provided on the downstream side of the valve 243a of the gas supply pipe 232a or on the downstream side of the valve 243c of the gas supply pipe 232c.

Any or all of the supply systems described above may be configured as an integrated supply system 248 in which the valves 243a to 243e, the MFCs 241a to 241e, and the like are integrated. The integrated supply system 248 is connected to each of the gas supply pipes 232a to 232e and configured such that the operations of supplying various gases to the gas supply pipes 232a to 232e, that is, the opening/closing operations of the valves 243a to 243e, the flow rate regulation operations of the MFCs 241a to 241e, and the like are controlled by a controller 121, which will be described later. The integrated supply system 248 has a modular structure, and is configured such that attachment/detachment of valves or the like to/from a base block may be performed on a module (functional block) basis and thus the maintenance, replacement, additional installation, or the like may be easily performed in the units of modules.

An exhaust pipe 231 configured to exhaust the atmosphere in the process chamber 201 is provided below the side wall of the reaction tube 203. The exhaust pipe may be heated by the heater 224. A vacuum pump 246 as an exhaust apparatus may be connected to the exhaust pipe 231 via a pressure sensor 245 as a pressure detector (pressure detection part) configured to detect the pressure in the process chamber 201 and an auto pressure controller (APC) valve 244 as a pressure regulator (pressure regulation part). The APC valve 244 may be configured to perform or stop the exhaust of the interior of the process chamber 201 by opening/closing the valve in a state in which the vacuum pump 246 is operated, and to regulate the pressure in the process chamber 201 by adjusting the opening degree of the valve based on pressure information detected by the pressure sensor 245. An exhaust system is mainly configured with the exhaust pipe 231, the APC valve 244, and the pressure sensor 245. The vacuum pump 246 may be considered to be included in the exhaust system.

The seal cap 219 is configured to be vertically raised/lowered by a boat elevator 115 as an elevating mechanism installed outside the reaction tube 203. The boat elevator 115 is configured as a transport device (transport mechanism) configured to load/unload (transport) wafers 200 into and out of the process chamber 201 by raising/lowering the seal cap 219.

Below the reaction tube 203, a shutter 219s, which serves as a furnace port cover configured to hermetically close the lower end opening of the reaction tube 203 in the state in which the seal cap 219 is lowered and the boat 217 is unloaded from the process chamber 201, may be installed. The shutter 219s is made of a metal material such as SUS, and is formed in a disk shape. An O-ring 220c, which serves as a sealing member making contact with the lower end of the reaction tube 203, is installed on the upper surface of the shutter 219s. The opening/closing operation (the raising/lowering operation, the rotating operation, or the like) of the shutter 219s is controlled by the shutter opener/closer 115s.

An exhaust hole 226, which is configured to exhaust an atmosphere of a space between the reaction tube 203 and the heater 207, is installed in the heater 207 above the reaction tube 203. An exhaust duct 227 is connected to the exhaust hole 226, and an air blower 228 is installed in the middle of the exhaust duct 227. The atmosphere of the space between the reaction tube 203 and the heater 207 is exhausted by the air blower 228. By exhausting the atmosphere of the space between the reaction tube 203 and the heater 207, it is possible to cool the boat 217 or the wafers 200 in the reaction tube 203 in a short time.

A temperature sensor 221 as a temperature detector may be installed in the reaction tube 203. By adjusting a state of supplying electric power to the heater 207 based on temperature information detected by the temperature sensor 221, an interior of the process chamber 201 has a desired temperature distribution. A temperature sensor 221 is installed along the inner wall of the reaction tube 203.

Figure 2:
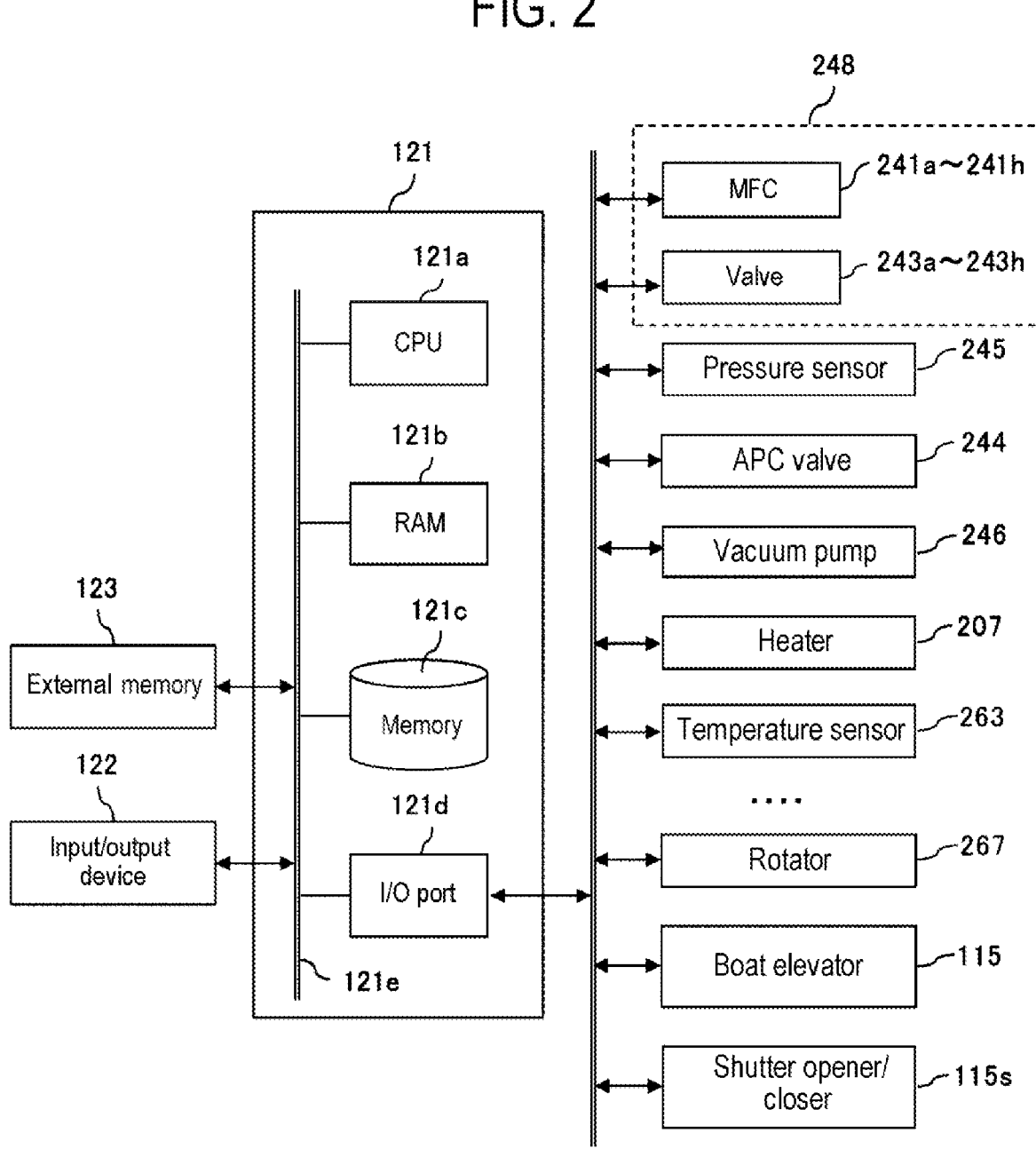
FIG. 2 is a schematic configuration of a controller 121 of the substrate processing apparatus suitably used in embodiments of the present disclosure, in which a control system of the controller 121 is shown in a block diagram.

As illustrated in FIG. 2, a controller 121, which is a control part (control unit), is configured as a computer including a central processing unit (CPU) 121a, a random-access memory (RAM) 121b, a memory 121c, and an I/O port 121d. The RAM 121b, the memory 121c, and the I/O port 121d are configured to be capable of exchanging data with the CPU 121a via an internal bus 121e. An input/output device 122 configured as, for example, a touch panel or the like is connected to the controller 121.

The memory 121c is configured by, for example, a flash memory, a hard disk drive (HDD), a solid-state drive (SSD), or the like. In the memory 121c, a control program for controlling operations of the substrate processing apparatus, a process recipe in which sequences and conditions of substrate processing to be described later are written, a cleaning recipe, and the like are readably stored. The process recipe is a combination that causes the controller 121 to execute each sequence in the substrate processing, which will be described later, to obtain a predetermined result, and functions as a program.

The cleaning recipe is a combination that causes the controller 121 to execute each sequence in the cleaning process, which will be described later, to obtain a predetermined result, and functions as a program. Hereinafter, the process recipe, the cleaning recipe, and the control program, and the like will be collectively referred to simply as a "program." The process recipe and the cleaning recipe are also simply referred to as a "recipe." When the term "program" is used in this specification, it may include a case where only a single recipe is included, a case where only a single control program is included, or a case where both the recipe and the program are included. The RAM 121b is configured as a memory area (work area) in which a program or data read by the CPU 121a are temporarily stored.

The I/O port 121d is connected to the above-mentioned MFCs 241a to 241e, valves 243a to 243e, pressure sensor 245, APC valve 244, vacuum pump 246, temperature sensor 263, heater 207, heater 224, an air blower 228, a rotator 267, a boat elevator 115, a shutter opener/closer 115s, and the like.

The CPU 121a is configured to read and execute a control program from the memory 121c, and to read a recipe from the memory 121c according to input of an operation command from the input/output device 122 and the like. The CPU 121a is configured to be capable of controlling the flow rate regulation operation of various gases by the MFCs 241a to 241e, the opening/closing operation of the valves 243a to 243e, the opening/closing operation of the APC valve 244, the pressure regulation operation by the APC valve 244 based on the pressure sensor 245, the starting and stopping of the vacuum pump 246, the temperature regulation operation of the heater 207 based on the temperature sensor 263, the rotation and rotation speed adjustment operation of the boat 217 by the rotator 267, the elevating operation of the boat 217 by the boat elevator 115, the opening/closing operation of the shutter 219s by the shutter opener/closer 115s, and the like.

The controller 121 may be configured by installing the above-described program stored in an external memory 123 on the computer. The external memory 123 includes, for example, a magnetic disk such as an HDD, an optical disk such as a CD, a magneto-optical disk such as an MO, a USB memory, a semiconductor memory such as an SSD, and the like. The memory 121c and the external memory 123 are each configured as a computer-readable recording medium. Hereinafter, these are also collectively referred to simply as a recording medium. When the term "recording medium" is used in this specification, it may include a case where only a memory 121c is included, a case where only an external memory 123 is included, or a case where both the memory 121c and the external memory 123 are included. The program may be provided to the computer by using communication systems such as the Internet or a dedicated line without using the external memory 123.

(2) Substrate Processing Process

As a process of manufacturing a semiconductor device using the above-described substrate processing apparatus, a substrate processing sequence example for forming a film on a wafer 200 as a substrate, that is, a film-forming sequence example, will be described. In the following description, the operation of each component of the substrate processing apparatus is controlled by the controller 121.

In the film-forming sequence of this embodiment, the wafer 200 in the high-temperature process container is exposed to an oxidizing agent and the surface of the wafer 200 is thermally oxidized to form a silicon oxide film.

When the term "wafer" is used in this specification, it may mean the wafer itself, or it may mean a laminate of a wafer and a predetermined layer or film formed on the surface of the wafer. In this specification, the term "wafer surface" may mean the surface of the wafer itself or the surface of a predetermined layer or the like formed on the wafer. In the present specification, when it is described that "a predetermined layer is formed on a wafer," it may mean that a predetermined layer is formed directly on the surface of the wafer itself or it may mean that a predetermined layer is formed on a layer or the like formed on the wafer. The use case where the term "substrate" is used in this specification is synonymous with the case where the term "wafer" is used.

(Wafer Charging and Boat Loading)

When the boat 217 is charged with a plurality of Si wafers 200 are loaded into (wafer charging), the shutter 219s is moved by the shutter opener/closer 115s and the lower end opening of the reaction tube 203 is opened (shutter opening). Thereafter, as illustrating in FIG. 1, the boat 217 supporting the plurality of wafers 200 is lifted up by the boat elevator 115 and loaded into the process chamber 201 (Boat Loading). The seal cap 219 finally closes the lower end of the reaction tube 203.

(Pressure Regulation and Temperature Adjustment)

The interior of the process chamber 201, that is, a space in which the wafers 200 are present is vacuum-exhausted (decompression-exhausted) by the vacuum pump 246 to have a desired pressure (degree of vacuum). At this time, the pressure in the process chamber 201 is measured by the pressure sensor 245, and the APC valve 244 is feedback-controlled based on the measured pressure information. At this time, the valve 243e may be opened to purge the interior of the process chamber 201 with an inert gas. In addition, the wafers 200 in the process chamber 201 are heated by the heater 207 to a desired temperature. At this time, the state of supplying electric power to the heater 207 is feedback-controlled based on the temperature information detected by the temperature sensor 263 so that the interior of the process chamber 201 has a desired temperature distribution. In addition, the rotation of the wafer 200 by the rotator 267 is started. The exhaust of the interior of the process chamber 201 and the heating and rotation of the wafers 200 are continuously performed at least until the processing of the wafers 200 is completed.

(Film-Forming Step)

An oxidizing gas or the like serving as an oxidizing agent is supplied to the wafers 200 in the process container. Specifically, the valves 243a and 243b are opened to supply the oxidizing gas and the hydrogen-containing gas to the water vapor generator 260 from the gas supply pipes 232a and 232b, respectively. Water vapor generated in the water vapor generator 260 is supplied into the process chamber 201 and exhausted via the exhaust pipe 231. Pyrogenic oxidation (wet oxidation) is performed by exposing the substrates to the water vapor. Dry oxidation may be performed in which an oxidizing gas other than water vapor is directly supplied from the gas supply pipe 232d to the process chamber.

An example of a processing condition in this step is described as follows:

Supply flow rate of oxidizing gas: 0.001 to 2 slm

Supply flow rate of hydrogen-containing gas: 0.001 to 2 slm

Supply time of each gas: 1 second to 1,200 minutes, specifically 10 to 600 minutes Processing temperature: 750 to 1,250 degrees C.

Processing pressure: 1 Pa to 101 kPa

In the present disclosure, the expression of a numerical range such as "750 to 1,250 degrees C." means that the lower limit value and upper limit value are included in the range. Therefore, for example, "750 to 1,250 degrees C." means "750 degrees C. or higher and 1,250 degrees C. or lower." The same applies to other numerical ranges.

After a desired thickness of an oxidized layer is formed, the valves 243a and 243c are closed to stop the supply of oxidizing gas and the like into the process chamber 201.

(Temperature Drop and Returning to Atmospheric Pressure)

After the film-forming step is completed, the heater 207 or the air blower 228 is controlled to lower the temperature in the process chamber to a predetermined temperature at a predetermined temperature decrease rate. At this time, purging may also be performed by opening the valve 243e, supplying an inert gas as a purge gas into the process chamber 201, and exhausting the purge gas from the exhaust pipe 231. In addition, by controlling the APC valve 244, the pressure in the process chamber 201 is returned to normal pressure (returning to atmospheric pressure).

(Boat Unloading and Wafer Discharging)

The seal cap 219 is lowered by the boat elevator 115 to open the lower end of the reaction tube 203. Then, the processed wafers 200 are unloaded from the reaction tube 203 from the lower end of the reaction tube 203 in the state of being supported by the boat 217 (boat unloading). After the boat is unloaded, the shutter 219s is moved to close the lower end opening of the reaction tube 203 (shutter closing). The processed wafers 200 are discharged from the boat 217 (wafer discharging).

(3) Cleaning in Process Chamber of Substrate Processing Apparatus

Next, a gas cleaning technique in the substrate processing apparatus of this embodiment will be described with reference to FIGS. 1 to 4.

The above-described substrate processing apparatus may contain contaminants (e.g., metallic impurities) in the process chamber thereof. The contaminants originate from, for example, the substrates, the material of the inner surface of the process chamber (e.g., the inner wall of the reaction tube 203 made of quartz), the material of components (e.g., the boat 217) disposed in the process chamber, and the like. Specifically, the contaminants include a first metal element and a second metal element as chemical elements. In this embodiment, the first metal element includes at least one selected from the group of Fe, Al, Cr, Ni, and Ti, and the second metal element includes at least one selected from the group of Mg, Ca, and Na.

Metallic impurities in quartz may be diffused by heat and evaporated from a surface of a synthetic quartz coating layer by passing through the synthetic quartz coating layer. There may be a concern that metal impurities originating from a quartz member migrate into an oxide film to be formed on the surface of the substrate. Oxidation of the silicon substrate progresses as $O_2$ diffuses through the oxide film and reaches the $Si/SiO_2$ interface, and Si atoms released from the interface are diffused into the oxide film. The impurities in the oxide film may inhibit the diffusion of the $O_2$ and Si atoms or may make the diffusion redundant. As a result, the thickness of the oxide film becomes uneven depending on a distribution of presence of metal impurities in the oxide film, and this phenomenon is called oxidation-moderated diffusion or oxidation-enhanced diffusion. Therefore, there is a demand for removal of metal impurities in the process chamber.

In this embodiment, contaminants are removed from the process chamber 201. This process is referred to as a "gas cleaning process" in the present disclosure.

The gas cleaning process of this embodiment is a gas cleaning process for removing contaminants containing a first metal element and a second metal element from the process chamber 201, wherein the gas cleaning process includes:

step A of removing the first metal element by supplying a halogen-containing gas into the process chamber 201 without supplying any oxygen-containing gas;

step B of removing the second metal element by supplying an oxygen-containing gas into the process chamber 201; and step C of forming a protective oxide film on at least one selected from the group of the inner surface of the process chamber 201 (e.g., the inner wall of the reaction tube 203), a component disposed in the process chamber 201 (e.g., the boat 217), and a dummy substrate for adhesion of the contaminants which is disposed in the process chamber 201.

Step B is performed continuously after step A. Step C is performed before step A.

Figure 3:
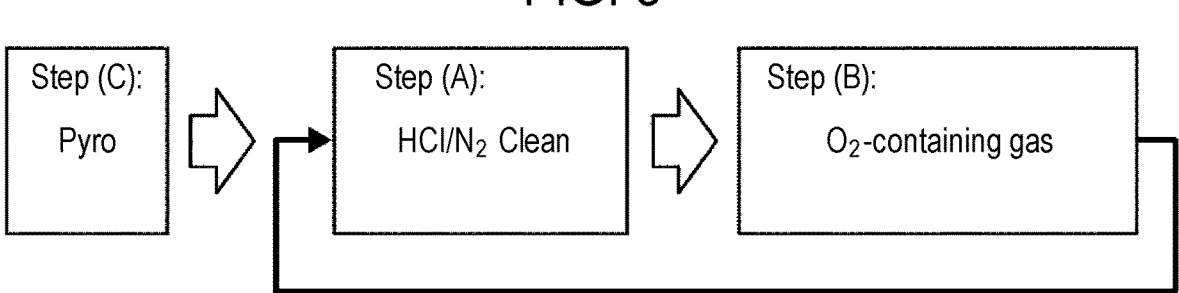
FIG. 3 is a flowchart of a gas cleaning process according to embodiments of the present disclosure.

Specifically, as illustrated in FIG. 3, in the gas cleaning process of this embodiment, after Step C (also referred to as "Pyro") is performed, a cycle is performed a predetermined number of times (n times, where n is an integer equal to or greater than 1), the cycle including step A (also referred to as "HCl/N₂ Clean") and step B (also referred to as "O₂-containing gas") subsequent to step A. It is desirable that steps A and B are performed before oxidation, diffusion and annealing on the substrate are performed in the process chamber 201.

In the following description, the operation of each component of the substrate processing apparatus is controlled by the controller 121.

(Boat Loading)

The shutter 219s is moved by the shutter opener/closer 115s to open the lower end opening of the reaction tube 203 (shutter opening). In this embodiment, thereafter, the boat elevator 115 in which only dummy substrates (not illustrated) are placed (that is, the boat 217 in which the wafers 200 are not loaded and dummy substrates are placed) is loaded into the process chamber 201. That is, in this embodiment, steps A and B are performed with the dummy substrates placed in the process chamber.

The dummy substrates are substrates for adhesion of contaminants. The material of the dummy substrates are not particularly limited, and may be, for example, silicon, quartz, or SiC. It is desirable that the dummy substrates include many gettering sites without containing no contaminants. For example, the dummy substrates may be silicon substrates, each of which has a Poly-Si film formed on the surface thereof by chemical vapor deposition (CVD). The dummy substrates may be arranged in the same number as the wafers 200 in the substrate processing process, but may be fewer than the wafers 200.

(Pressure Regulation and Temperature Adjustment)

The interior of the process chamber 201 is vacuum-exhausted by the vacuum pump 246 to have a desired pressure (degree of vacuum). In addition, the interior of the process chamber 201 is heated by the heater 207 to reach a desired temperature. At this time, the members inside the process chamber 201, that is, the inner wall of the reaction tube 203, the surface or inner portion (inner wall) of the gas supply path 233, the surface of the boat 217, and the like are also heated to a desired temperature. After the temperature inside the process chamber 201 reaches the desired temperature, the temperature is controlled to be maintained constant until a gas cleaning process, which will be described later, is completed. It is desirable that steps A and B are performed continuously at a processing temperature between 800 degrees C. and 1,300 degrees C. When the temperature exceeds 1,300 degrees C., the wafers warp or slip transition occurs in the wafers, but when the temperature is 1,300 degrees C. or lower, these problems may be prevented. When the temperature is lower than 800 degrees C., due to a decrease in diffusion coefficient, it is difficult for the metal impurities to reach a surface, so that it is difficult to be chlorinated or oxidized, and also to be evaporated, which results in a very long cleaning time. However, when the temperature is 800 degrees C. or higher, it is possible to perform the process in a practical amount of time.

(Gas Cleaning Process)

Thereafter, steps A to C are executed.

The valves 243a to 243e are closed before step C is performed.

[Step C]

Step C is performed for the first time. In step C, a protective oxide film is formed on the inner surface of the process chamber 201 (e.g., the inner wall of the reaction tube 203), a component disposed in the process chamber (e.g., the boat 217), and the dummy substrates disposed in the process chamber 201.

Well-known pyrogenic oxidation (Pyro oxidation) or the like may be used as a method for forming the protective oxide film.

In this embodiment, in the same manner as the pyrogenic oxidation in the above-described substrate processing process, the valves 243a and 243b are opened, and an oxidizing gas and a hydrogen-containing gas are respectively supplied from the gas supply pipes 232a and 232b to the water vapor generator 260. Water vapor generated in the water vapor generator 260 is supplied into the process chamber 201, so that the substrates are exposed to the water vapor. The flow rate of the hydrogen-containing gas is regulated by the MFC 241c, and the flow rate of the oxidizing gas regulated by the MFC 241e. At this time, an inert gas may be supplied into the process chamber 201 by opening the valve 243e. The CPU 123a closes the valves 243a, 243b, and 243e after a predetermined period of time has elapsed since the valves 243a and 243b were opened, and step C is ended.

By performing step C, the Si or SiC surfaces are oxidized by water vapor generated by burning the oxidizing gas and the hydrogen-containing gas, and the inner surface of the process chamber 201 (e.g., the inner wall of the reaction tube 203), the surface of a component disposed in the process chamber (e.g., the boat 217 made of SiC), and the surfaces of the dummy substrates placed in the process chamber are covered with an oxide film. This oxide film functions as a protective oxide film that protects a base material from excessive etching by a chlorine-containing gas in the subsequent step A. In step C, no additional oxide layer is formed on a bulk of SiO₂, such as the reaction tube 203. Step C may be performed either in-situ or ex-situ. That is, when a protective oxide film has already been formed on a member other than the dummy substrates, or a protective oxide film is unnecessary, the process of step C on the dummy substrates may be performed in another apparatus.

[Step A]

Next, step A is performed. In step A, the first metal element is removed by supplying a chlorine-containing gas into the process chamber 201 without supplying any oxygen-containing gas. That is, the first metal element is removed by being chlorinated and vaporized. It is desirable that the chlorine-containing gas is a mixed gas containing HCl gas and an inert gas. The inert gas lowers a partial pressure of a vaporized metal chloride, promotes vaporization, and suppresses sublimation during discharge. Inexpensive $N_2$ gas may be used as the inert gas.

Specifically, in this embodiment, a chlorine-containing gas and an inert gas are supplied into the process chamber 201, and an oxygen-containing gas is not supplied. Specifically, the valve 243c is opened to allow the chlorine-containing gas to flow into the gas supply pipe 232c. The flow rate of the chlorine-containing gas is regulated by the MFC 241c, and then the chlorine-containing gas is supplied into the process chamber 201 through the gas supply path 233, and exhausted through the exhaust pipe 231a. At this time, the valve 243 e is opened to supply the inert gas ($N_2$ gas) into the process chamber 201. Valves 243b and 243d remain closed. The CPU 123a closes the valves 243c and 243e after a predetermined period of time has passed since the valve 243d was opened, and step A is ended.

By performing step A, among the contaminants in the vacuum-exhausted process chamber 201, the first metal element easily reacts with the chlorine-containing gas (that is, easily chlorinated) and easily forms highly volatile chlorides (e.g., $AlCl_3$ or the like). This chloride is easily desorbed (easily vaporized) from a surface such as the inner surface of the process chamber 201 in a vacuum. As a result, the first metal element is removed from the surface such as the inner surface of the process chamber 201. Since step A sequentially removes the first metal element that has reached the surface due to diffusion from inside of the main body of the process container having a thickness of 10 mm or more, step A may take a longer time than other steps B and C.

[Step B]

Next, step B is performed.

In step B, the second metal element is removed by supplying an oxygen-containing gas (oxidizing gas) into the process chamber 201. That is, the second metal element is removed by being oxidized and vaporized.

It is desirable that the oxygen-containing gas is an $O_2$ gas.

In step B, it is desirable to supply the oxygen-containing gas such that it becomes an oxygen partial pressure (1 Pa or more) for passively oxidizing a SiC component disposed in the process chamber 201. Passive oxidation of SiC is a mode in which SiC is turned into $SiO_2$ to form a protective film rather than being turned into SiO and vaporized. It is desirable to set the processing temperature in step B to be the same as that in step A because there is no waiting time for temperature adjustment, but may be set to be different from that in step A.

Specifically, in this embodiment, the valve 243d is opened to allow the oxygen-containing gas to flow into the gas supply pipe 232e. The flow rate of the oxygen-containing gas is regulated by the MFC 241d, and then the oxygen-containing gas is supplied into the process chamber 201 through the gas supply path 233, and exhausted from the exhaust pipe 231. At this time, the inert gas may be supplied into the process chamber 201 by opening the valve 243e. The CPU 123a closes the valves 243d and 243e after a predetermined period of time has elapsed since the valve 243d was opened, and step B is ended.

By performing step B, the second metal element in the vacuum-exhausted process chamber 201 easily reacts with the oxygen-containing gas (that is, easily oxidized) and easily forms an oxide. This oxide is easily desorbed (easily vaporized) from a surface such as the inner surface of the process chamber 201 in a vacuum. As a result, the oxidized second metal element is removed from the surface such as the inner surface of the process chamber 201.

In this embodiment, step B is performed continuously after step A. However, after performing step A and before performing step B, a step of switching between multiple types of oxidizing gases to form an oxide film on the surfaces of the substrates may be performed. For example, introducing water vapor into the process chamber 201 in step B may facilitate the removal of a water-soluble metal chloride.

[Performing Predetermined Number of Times]

Contaminants may be further removed from the process chamber by performing a cycle including steps A and B described above a predetermined number of times (one or more times). The cumulative time of step A is set such that the deviation of the thickness of the oxide film obtained by the oxidizing process of the Si substrates performed after the gas cleaning is within a predetermined value, or the predetermined impurity density in the film is set to a predetermined value (e.g., $1 \times 10^{10}$) [atoms/cm$^2$] or less).

(Temperature Drop and Returning to Atmospheric Pressure)

After the gas cleaning process is completed, the temperature inside the process chamber 201 is lowered and the interior of the process chamber 201 is purged (after-purge) by the same procedure as the temperature drop in the substrate processing process described above. Thereafter, the pressure inside the process chamber 201 is returned to normal pressure (returning to atmospheric pressure).

(Boat Unloading)

The seal cap 219 is lowered by the boat elevator 115 to open the lower end of the reaction tube 203. Then, the boat 217 is unloaded from the lower end of the reaction tube 203 to the exterior of the reaction tube 203 (boat unloading).

(Dummy Substrate Replacement Step)

In this embodiment, a dummy substrate replacement step may be performed continuously.

In the dummy substrate replacement step, the dummy substrates which is placed in the boat 217 and to which the contaminants adhere are replaced with new dummy substrates, and the above-described gas cleaning process is performed again. When the substrate processing step is performed continuously, all or some of the dummy substrates are removed and stored in a container such as a FOUP.

By performing the dummy substrate replacement step, there is no re-emission of contaminants from the dummy substrates, and the contaminants contained in the process chamber 201 are effectively removed from a surface such as the inner surface of the process chamber 201.

When these series of processes are completed, the above-described substrate processing processes are resumed.

Figure 4:
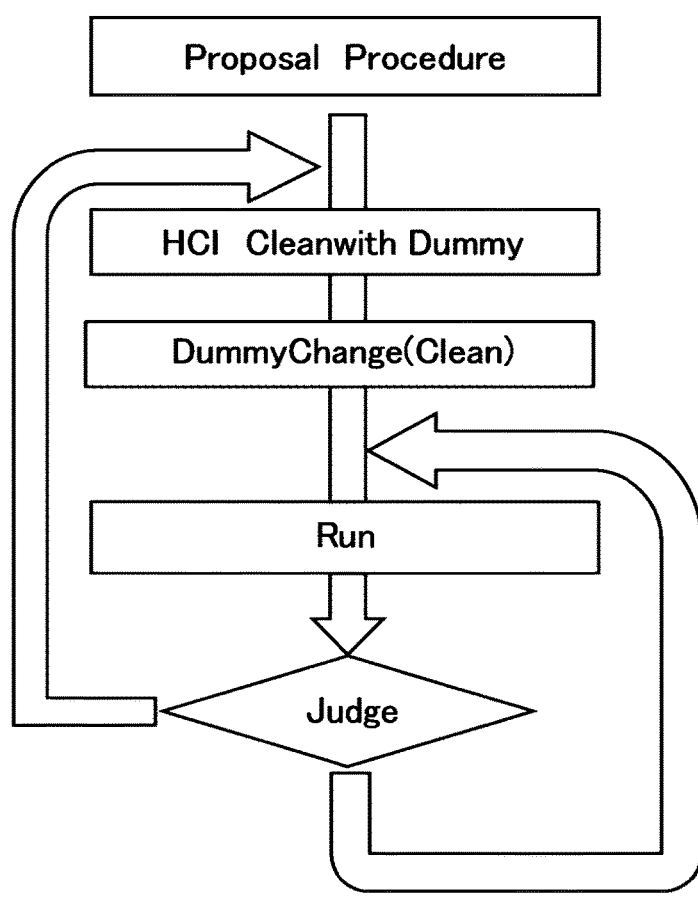
FIG. 4 is a flowchart of a process performed by a substrate processing apparatus according to embodiments of the present disclosure.

In this embodiment, as illustrated in FIG. 4, it is desirable to perform "HCl Clean with Dummy" (i.e., the gas cleaning process), and to perform "Run" (i.e., the substrate processing process) after performing "Dummy Change (Clean)" (i.e., the dummy substrate replacement step). Subsequently, the CPU 121a determines whether to perform the gas cleaning process or to execute the substrate processing process after the substrate processing process is performed ("Judge"). For example, the CPU 121a counts the number of days that have elapsed from the date the gas cleaning process was performed to the date the substrate treatment process was performed, and determines whether or not the number of elapsed days exceeds a predetermined number of days. When it is determined that the number of elapsed days exceeds the predetermined number of days, the CPU causes the cleaning process to be performed, and when it is determined that the number of elapsed days does not exceed the predetermined number of days, the CPU causes the substrate processing process to be performed. Alternatively, the CPU 121a counts the number of executions of the substrate processing process or the period of time during which the substrate processing process has been performed, and determines whether or not the number of executions exceeds a predetermined number of times. When it is determined that the number of executions exceeds the predetermined number of times, the CPU causes the cleaning process to be performed, and when it is determined that the number of executions does not exceed the predetermined number of times, the CPU causes the substrate processing process to be performed.

(4) Effects of this Aspect

According to this embodiment, one or more of the following effects are obtained.

The gas cleaning method of this embodiment is a gas cleaning method of removing contaminants containing a first metal element and a second metal element from the process chamber 201, and includes (a) removing the first metal element by supplying a chlorine-containing gas into the process chamber 201 without supplying an oxygen-containing gas; and (b) removing the second metal element by supplying an oxygen-containing gas into the process chamber 201, wherein (b) is performed after (a). As a result, the contaminants contained in the process chamber 201 are gasified and removed to the exterior of the process chamber 201. Specifically, in (a), the first metal element contained in the process chamber 201 is turned into a highly volatile chloride so as to be removed to the exterior of the process chamber 201. In (b), the second metal element contained in the process chamber 201 is oxidized and vaporized so as to be removed to the exterior of the process chamber 201. Therefore, it makes metal impurities originating from a member disposed in the process chamber 201 difficult to migrate into a film formed on the surface of a substrate. For example, the diffusion rate of $O_2$ or the like during the formation of an oxide (e.g., $SiO_2$) film is less affected by contaminants. As a result, with the cleaning method of this embodiment, it is possible to form a film having a more uniform thickness on the surface of a substrate.

In this embodiment, in (a), the first metal element is removed by supplying a chlorine-containing gas into the process chamber 201 without supplying any oxygen-containing gas. As a result, compared to the case of supplying an oxygen-containing gas and a chlorine-containing gas into the process chamber 201, the first metal element contained in the process chamber 201 is more easily removed to the exterior of the process chamber 201.

This effect will be described with reference to FIG. 5 with respect to the case where the chloride-containing gas is HCl gas and the oxygen-containing gas is $O_2$ gas. A standard electrode potential in FIG. 5 indicates that an element tends to become cations. For example, an element having a lower standard electrode potential tends to lose electrons and becomes cations. A standard production enthalpy in FIG. 5 indicates a change in chemical energy when a substance of 1 mol is produced from a standard substance. For example, a substance having a small standard production enthalpy is easily produced.

As shown in FIG. 5, the standard production enthalpies of $AlCl_3$ and $TiCl_4$ are less than $-700$ kJ/mol. From this, it can be seen that Ti and Al have strong reactivity with Cl among typical metal elements. Therefore, when one of Ti and Al remains in the process chamber 201, the one of Ti and Al reacts with HCl and is dispersed in the atmosphere in the process chamber 201 to be easily captured by a substrate (e.g., a wafer). The standard production enthalpy of $\alpha$-$Al_2O_3$ is $-1,675.7$ kJ/mol. Therefore, it can be seen that the chlorination reaction in the state in which $O_2$ is not included is suitable in order to remove Al contained in the process chamber 201.

In the case where the process chamber 201 contains Al, when HCl gas is supplied into the process chamber 201 together with $O_2$ gas as in the related art, the $O_2$ gas oxidizes Al and tends to form an oxide ($Al_2O_3$) that is difficult to etch. As a result, it is difficult to remove Al contained in the process chamber 201 to the exterior of the process chamber 201. In particular, Al, Fe, and Cu tend to become oxides when HCl gas is supplied into the process chamber 201 together with $O_2$ gas.

In the case where the process chamber 201 contains Al, when HCl gas is supplied into the process chamber 201 without supplying $O_2$ gas, the HCl gas tends to chlorinate Al to form a volatile chloride ($AlCl_3$). As a result, Al contained in the process chamber 201 is easily removed to the exterior of the process chamber 201. In particular, K, Ca, Al, Ni, and Cu tend to become chlorides when HCl gas is supplied into the process chamber 201 without supplying $O_2$ gas.

This embodiment further includes (c) forming a protective oxide film on at least one selected from the group of the inner surface of the process chamber 201, a component disposed in the process chamber 201, and a dummy substrate for adhesion of contaminants which is disposed in the process chamber 201, wherein (c) is performed before (a). As a result, when the inner surface of the process chamber 201, the component disposed in the process chamber 201, and the dummy substrate are made of silicon, the inner surface of the process chamber 201 and the like are difficult to etch in step (a). When the dummy substrate and the like are made of silicon and the protective oxide film is not formed, the following chemical reaction occurs in (a), thereby severely etching the dummy substrate and the like and generating a large amount of by-products.

$$Si+4HCl \rightarrow SiCl_4+2H_2$$

In this embodiment, (a) and (b) are performed in the state in which a dummy substrate for adhesion of contaminants is disposed in the process chamber 201. As a result, in (a) and (b), vaporized contaminants (e.g., molecules containing contaminants) are easily captured (gettered) by the dummy substrate. As a result, the contaminants contained in the process chamber 201 are more easily removed to the exterior of the process chamber 201.

Figure 6:
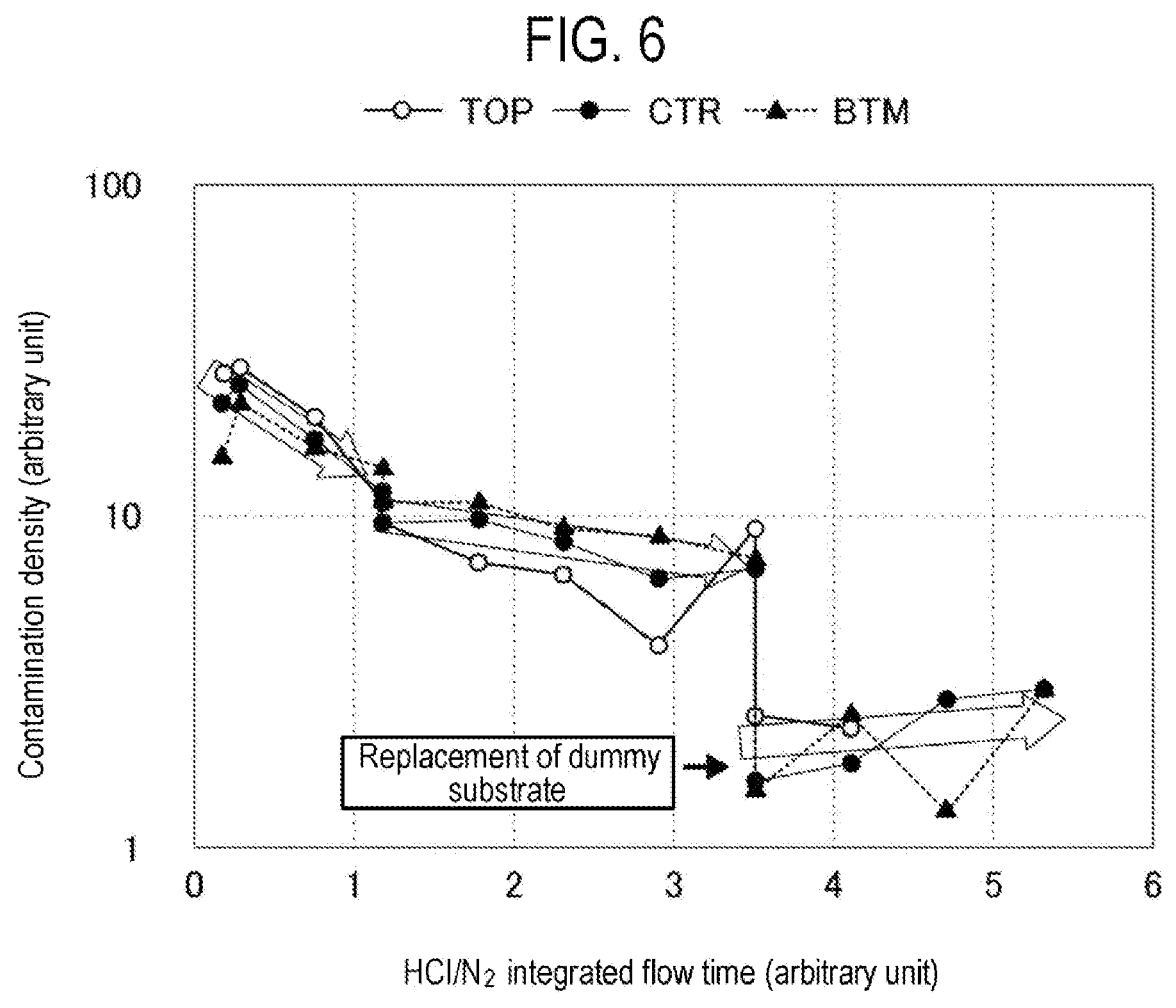

FIGS. 6 and 7 show measurement results of a contamination density and a film thickness range obtained by repeating the gas cleaning of this embodiment and the substrate processing process of forming a PYRO oxide film of 400 nm on wafers. The contamination density is the density of contaminants in a PYRO oxide film. It was confirmed that as (a) and (b) are repeated multiple times and the cumulative time of (a) increases, the density per unit area of Al, which is one of the contaminants, and the film thickness range decrease. Here, the contamination density is a density of contaminants in a PYRO oxide film. The film thickness range is a width of variation in film thickness of each of the wafers 200 at the top, center, and bottom mounting positions of the boat 217, and the smaller the film thickness range, the better the uniformity. It was also confirmed that there is a positive correlation between the contamination density and the film thickness range, the film thickness range increases to a size that poses a problem in terms of quality control when the density of Al exceeds $1\times10^{10}$ [atoms/cm$^2$], and saturation occurs between 2 nm and 3 nm when the density of Al is less than $1\times10^9$ [atoms/cm$^2$]. From FIGS. 6 and 7, it may be understood that, when these reductions are saturated, the reductions may be further reduced by replacing the dummy substrates.

In this embodiment, it is desirable to perform (a) and (b) before the substrates are oxidized, diffused, and annealed in the process chamber 201. Accordingly, the substrates are oxidized, diffused, and annealed in the process chamber 201 from which contaminants have been removed. As a result, a film having a more uniform film thickness is easily formed on the surfaced of the substrates.

(Modification 1)

The gas cleaning method of this embodiment includes (c), but the gas cleaning method of the present disclosure may not include (c).

(Modification 2)

In the gas cleaning method of this embodiment, in (a), the first metal element is removed by chlorinating and vaporizing the first metal element, and in (b), the second metal element is removed by oxidizing and vaporizing the second metal element. However, in the present disclosure, in (a), the first metal element may not be removed by chlorinating and vaporizing the first metal element, and in (b), the second metal element may not be removed by oxidizing and vaporizing the second metal element.

(Modification 3)

In the gas cleaning method of this embodiment, (b) is performed after (a). However, in the present disclosure, it may not perform (b) subsequent to (a).

(Modification 4)

In the gas cleaning method of this embodiment, (a) and (b) are performed in the process chamber 201 in the state in which a dummy substrate for adhesion of contaminants is disposed in the process chamber 201. However, in the present disclosure, (a) and (b) may not be performed in the process chamber 201 in the state in which a dummy substrate for adhesion of contaminants is not disposed in the process chamber 201.

(Modification 5)

In the gas cleaning method of this embodiment, (a) and (b) are repeated multiple times. However, in the present disclosure, (a) and (b) may not be repeated multiple times.

(Modification 6)

In the gas cleaning method of this embodiment, (a) and (b) are performed before the substrate is oxidized, diffused, and annealed in the process chamber 201. However, in the present disclosure, (a) and (b) may not be performed before the substrate is oxidized, diffused, and annealed in process chamber 201.

The various aspects and modifications described above may be used in appropriate combination. The processing sequences and processing conditions at this time may be, for example, the same as the processing sequences and processing conditions of the above-described aspect.

According to the present disclosure, it is possible to form a film having a more uniform thickness on the surface of a substrate.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A gas cleaning method comprising:
   (a) removing a first metal element as one of contaminants from a process chamber by supplying a chlorine-containing gas into the process chamber without supplying an oxygen-containing gas; and
   (b) removing a second metal element as another one of the contaminants from the process chamber by supplying the oxygen-containing gas into the process chamber,
   wherein (b) is performed after (a), and
   wherein (a) and (b) are performed before performing a process of oxidizing, diffusing, and annealing a substrate in the process chamber.

2. The gas cleaning method of claim 1, further comprising:
   (c) forming a protective oxide film on at least one selected from the group of an inner surface of the process chamber, a component disposed in the process chamber, and a dummy substrate for adhesion of the contaminants which is disposed in the process chamber,
   wherein (c) is performed before (a).

3. The gas cleaning method of claim 1, wherein, in (a), the first metal element is removed by being chlorinated and vaporized, and
   wherein, in (b), the second metal element is removed by being oxidized and vaporized.

4. The gas cleaning method of claim 1, wherein the chlorine-containing gas is a mixed gas containing HCl gas and an inert gas, and
   wherein the first metal element includes at least one selected from the group of Fe, Al, Cr, Ni, and Ti.

5. The gas cleaning method of claim 1, wherein the second metal element includes at least one selected from the group of Mg, Ca, and Na.

6. The gas cleaning method of claim 1, wherein the oxygen-containing gas includes $O_2$ gas.

7. The gas cleaning method of claim 1, wherein (b) is continuously performed after (a).

8. The gas cleaning method of claim 1, wherein the process chamber is made of quartz, and wherein a component for supporting the substrate, which is disposed in the process chamber, is made of silicon, quartz, or SiC.

9. The gas cleaning method of claim 4, wherein the inert gas includes at least one selected from the group of $N_2$ and Ar.

10. The gas cleaning method of claim 1, wherein (a) and (b) are performed in a state in which a dummy substrate for adhesion of the contaminants is disposed in the process chamber.

11. The gas cleaning method of claim 1, wherein, in (b), the oxygen-containing gas is supplied to have an oxygen partial pressure for passively oxidizing a component disposed in the process chamber.

12. The gas cleaning method of claim 1, wherein (a) and (b) are performed continuously at an equal processing temperature between 800 degrees C. and 1,300 degrees C.

13. The gas cleaning method of claim 1, wherein (a) and (b) are repeatedly performed multiple times.

14. A non-transitory computer-readable recording medium storing a program that causes, by a computer, a substrate processing apparatus to perform a process comprising the gas cleaning method of claim 1.

15. A method of processing a substrate, comprising: gas cleaning of removing contaminants containing a first metal element and a second metal element from a process chamber; and processing the substrate by supplying a processing gas to the substrate in the process chamber, wherein the gas cleaning comprises: (a) removing the first metal element by supplying a chlorine-containing gas into the process chamber without supplying an oxygen-containing gas; and (b) removing the second metal element by supplying the oxygen-containing gas into the process chamber, wherein (b) is performed after (a), and wherein (a) and (b) are performed before performing a process of oxidizing, diffusing, and annealing the substrate in the process chamber.

16. A method of manufacturing a semiconductor device, comprising the method of claim 15.

17. A substrate processing apparatus comprising: a process chamber in which a substrate is accommodated; a gas supplier connected to the process chamber and configured to supply a processing gas, a chlorine-containing gas, and an oxygen-containing gas into the process chamber; and a controller configured to be capable of controlling the gas supplier so as to perform a process including: (a) removing a first metal element as one of contaminants from the process chamber by supplying the chlorine-containing gas into the process chamber without supplying the oxygen-containing gas; and (b) removing a second metal element as another one of the contaminants from the process chamber by supplying the oxygen-containing gas into the process chamber after (a), and wherein (a) and (b) are performed before performing a process of oxidizing, diffusing, and annealing the substrate in the process chamber.

* * * * *